United States Patent [19]

Fujimura et al.

[11] Patent Number: 4,938,839
[45] Date of Patent: Jul. 3, 1990

[54] METHOD OF REMOVING PHOTORESIST ON A SEMICONDUCTOR WAFER

[75] Inventors: Shuzo Fujimura, Tokyo; Yasunari Motoki, Kawasaki; Yoshikazu Kato, Mizusawa, all of Japan

[73] Assignee: Fujitsu Limited, Kanagawa, Japan

[21] Appl. No.: 257,165

[22] Filed: Oct. 11, 1988

Related U.S. Application Data

[63] Continuation of Ser. No. 14,694, Feb. 13, 1987, abandoned.

[30] Foreign Application Priority Data

Feb. 14, 1986 [JP] Japan .................. 61-030327

[51] Int. Cl.⁵ ............... H01L 21/24; H01L 21/308
[52] U.S. Cl. .................... 156/628; 156/643; 156/668; 437/229
[58] Field of Search ............... 156/345, 643, 628, 646, 156/668; 437/229; 430/329

[56] References Cited

U.S. PATENT DOCUMENTS

| | | | |
|---|---|---|---|
| 4,241,165 | 12/1980 | Hughes et al. | 430/269 |
| 4,264,393 | 4/1981 | Gorin et al. | 156/345 |
| 4,292,384 | 9/1981 | Straughan et al. | 430/5 |
| 4,522,681 | 6/1985 | Gorowitz et al. | 156/643 |
| 4,565,601 | 1/1986 | Kakehi et al. | 156/643 |
| 4,673,456 | 6/1987 | Spencer et al. | 156/345 |

FOREIGN PATENT DOCUMENTS

| | | | |
|---|---|---|---|
| 0216603A3 | 4/1987 | European Pat. Off. | |
| 57-66642 | 4/1982 | Japan | 156/345 |
| 57-96529 | 6/1982 | Japan | 156/643 |
| 58-153332 | 9/1983 | Japan | 156/345 |

OTHER PUBLICATIONS

Eparath, "Plasma Reactor For Dry Development of Resist", IBM TDB, vol. 24, No. 12, pp. 6268-6269, May 1982.

Journal of the Electrochemical Society, vol. 131, No. 5, May 1984, pp. 1164-1169, Manchester, N.H., US; J. J. Hannon et al.: "Oxidative Removal of Photoresist by Oxygen/Freon 116 Discharge Products".

Journal of the Electrochemical Society, vol. 114, No. 8, Aug. 1967, p. 213C, Abstract No. 180, Manchester, N.H., US; S. M. Irving: "A Dry Photoresist Removal Method".

Primary Examiner—Kenneth M. Schor
Attorney, Agent, or Firm—Staas & Halsey

[57] ABSTRACT

After a semiconductor wafer is processed, a photoresist on the semiconductor wafer is removed by an irradiation of oxygen plasma while the wafer is cooled by a cooling device. The cooling device can be a susceptor or a stage on which the wafer is placed, and coolant flows through a pipe or duct installed thereto. Cooling of the wafer prevents the photoresist from being softened by the heat from the plasma. Thus, the inner side of the photoresist remains hard enough to support the affected surface portion of the photoresist, which is also difficult to remove, preventing the affected surface portion from sticking onto the surface of the wafer. Therefore, the affected portion can be more effectively irradiated by the plasma, and can be decomposed without leaving residue on the wafer. Reduced residue on the wafer surface contributes to improve production yield and quality of the products made from this wafer.

7 Claims, 1 Drawing Sheet

METHOD OF REMOVING PHOTORESIST ON A SEMICONDUCTOR WAFER

This is a continuation of co-pending application Ser. No. 14,694, filed on Feb. 13, 1987, now abandoned.

BACKGROUND OF THE INVENTION

1. Field of the Invention

This invention relates to an improvement of a method of removing a photoresist film on a semiconductor wafer in a reactive plasma.

2. Description of the Related Art

As a very general way for fabricating semiconductor devices, a semiconductor wafer masked with a patterned photoresist film is chemically processed, such as by etching etc. After the wafer is etched, the photoresist is no longer needed, so the photoresist must be removed. Removal of the used photoresist has been carried out by a wet chemical processing. However, if the photoresist is affected by the wafer processing, the used photoresist can not be readily removed by wet chemical processing. The photoresist is affected in the following cases. (a) When the wafer has been ion implanted, the surface of the photoresist is also ion implanted causing dissociation of hydrogen and oxygen atoms therefrom, thus carbonates of the photoresist material are produced on the surface. (b) Fluorine radicals in a gas mixture, such as carbon tetrafluoride ($CF_4$)+5~30% oxygen ($O_2$) generally used for etching polycrystalline silicon or silicon dioxide ($SiO_2$), produces fluorides of the photoresist material. Such fluorides can not be removed by the wet chemical processing. (c) Chlorine or chloride gas, e.g. $CCl_4$ etc., used in reactive ion etching (referred to hereinafter as RIE) for etching aluminum produces aluminum chloride (AlCl), which deposits on the surface of the photoresist. (d) $CF_4$ used in RIE produces polymers, such as $CF_1$, $CF_2$ etc. on the surface of the photoresist. Such polymers are difficult to be removed by wet chemical processing.

In order to remove these affected photoresists which can not be readily removed by wet chemical processing, an ashing method has been employed. The ashing is carried out by exposing the photoresist to an oxygen plasma, which can be provided using conventional plasma etching apparatus. The mechanism of the plasma ashing is mainly by dissociation of the atomic bonds in the photoresists material caused by the bombardment with charged particles and ultra violet radiation, both generated in the plasma, and the raised temperature of the photoresist also helps the dissociation. Thus dissociated atoms are chemically activated to combine with oxygen to produce $CO_2$ for example, a compound which is volatile and easily removed. During the ashing process, the surface portion of the photoresist that has been affected by the previous wafer processing is decomposed only slowly and difficultly, however, the inner side of the photoresist is thermally decomposed and softened at the same time, because photoresists are generally composed of plastic resin such as polymethylmethacrylate. During the ashing process, the affected surface of the photoresist turns into small particles sticking onto the surface of the wafer. These particles must be removed by a wet chemical washing. However, the thusly removed particles remain intact in the chemical solution, and may deposit again on the surface of the wafer. Deposition of such particles on the wafer surface causes decreased production yield as well as lowered quality of the product.

On the other hand, the recent trend of high density semiconductor fabrication has created problems as follows.

A. Ion implantation is increasingly employed, particularly for fabricating highly doped regions, for example the regions between source and drain. Therefore, by the ion implantation the photoresist film is also attacked and becomes a more stubborn affected material which is more difficult to remove from the surface of the resist film, particularly when heavy ions, such as phosphorus ion ($P^+$) or arsenic ion ($As^+$), are implanted in large doses such as $1 \times 10^{15}$ cm$^{-2}$ or more.

B. A higher density of integration makes the device more susceptible to residual particles.

C. High energy irradiation by RIE having a sputtering function is effective to remove the stubborn affected photoresist described above in paragraph A. However, with this method the high energy active species may more easily cause softening of the not-affected inner side of the photoresist. Then, the affected surface portion of the photoresist sinks into the softened inner portion. The sunken affected surface is thus prevented from being adequately bombarded and finally sticks to the surface of the wafer. Thus, more of the affected portions stick onto the wafer in particles. The high energy RIE bombardment onto the wafer also may damage the quality of the semiconductor products made from this wafer.

As seen in the above description, and as reported by R. L. Maddox et al. in "Applications of Reactive Plasma Practical Microelectronics Processing Systems", April 1978, SOLID STATE TECHNOLOGY, in the past, and prior to the recognition of the problems discussed above, there has been no suggestion nor need for cooling the wafers and the photoresist during the removal of the photoresist, because it is rather advantageous for the photoresist to be kept at high temperatures to increase the ashing rate, i.e., the speed of reducing the photoresist. On the other hand, semiconductor wafers have been cooled during plasma etching, as is proposed by the inventor in provisional publication of Japanese Utility Patent, 56-14366. The advantage of cooling a semiconductor wafer during the wafer etching process is as follows. The plasma, having a high temperature, heats the wafer as well as the photoresist, resulting in promotion of deterioration (e.g. decomposition) and deformation (i.e. softening) of the photoresist. The deteriorated photoresist is more liable to be etched during the wafer etching process. Therefore, the wafer has been cooled to avoid the deterioration and deformation of the photoresist. Thus, the selection ratio of etching, i.e. the ratio of etching rate of the portion to be etched to that of the photoresist, or the etching rate of the portion to be etched to that of the underlayer, such as silicone dioxide or phosphorous silicate glass, could be improved, resulting in improved fabrication accuracy.

SUMMARY OF THE INVENTION

It is a general object of the invention, therefore, to provide a method for efficiently removing the affected photoresist without damaging the wafer.

According to the present invention, affected photoresist on a semiconductor wafer is removed by exposure to a plasma of a reaction gas while the wafer is cooled by a cooling device. Accordingly temperature rise of the photoresist during its removal process in the gas plasma is suppressed. Consequently, the inner portion of the photoresist which is not affected is prevented from softening so that it can support the affected surface portion. Thus, the affected surface portion does not sink into the inner portion of the photoresist, and the affected surface of the photoresist remains in a condition where it is readily bombarded by the plasma before the affected surface region sticks on to the wafer surface, resulting in good removal of the photoresist.

The above-mentioned features and advantages of the present invention, together with other objects and advantages, which will become apparent, will be more fully described hereinafter.

DESCRIPTION OF THE PREFERRED EMBODIMENT

Figure 1:
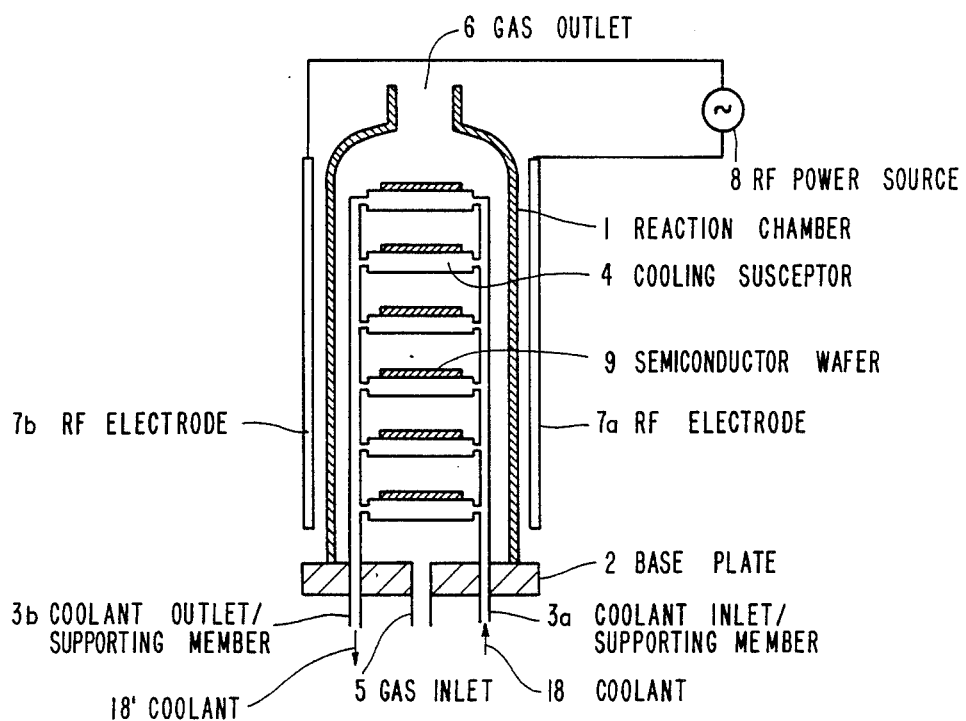
FIG. 1 is a schematic cross-sectional view illustrating a barrel type plasma processing apparatus for conducting an embodiment of the present invention.

Referring now to the radio frequency plasma processing apparatus of the so-called barrel type for simultaneously removing affected photoresist from a plurality of semiconductor wafers as illustrated in FIG. 1, the details of preferred embodiments of the invention and the function of the apparatus shall be hereinafter described.

In an earlier step of the fabrication process for semiconductor wafers, phosphorus ions ($p^+$), for example, have been ion implanted using an acceleration energy of 120 KeV as much as $3 \times 10^{15}$ cm$^{-2}$ into semiconductor wafers 9 having a 1.2 um thick photoresist layer thereon. Thus, an affected layer is undesirably formed on the surface of the photoresist layer. Such semiconductor wafers 9 are loaded onto the cooling susceptors 4 of the apparatus keeping the affected photoresist-coated surface facing upwardly. The cooling susceptors 4 are cooled by coolant 18 flowing therethrough introduced from a coolant inlet 3a and drained through a coolant outlet 3b. The coolant inlet 3a and the coolant outlet 3b are made of pipe, and also act as supporting members for the cooling susceptors 4. Reaction chamber 1 is made of dielectric material, quartz for example, and the shape is like a cylinder. The bottom of the chamber 1 is open and has a flat open edge. The chamber 1 is placed onto the flat upper surface of a base plate 2 to make a vacuum seal, thus containing the cooling susceptors 4 and wafers 9 thereon within chamber 1. A reaction gas mainly composed of oxygen is fed through a gas inlet 5 at a flow rate of approximately 500 cc/min into the reaction chamber 1. At the same time, the reaction chamber 1 is evacuated through a gas outlet 6 by an evacuation pump (not shown in the figure) to keep the inside of the chamber 1 at a vacuum of approximately 1 Torr. RF electrode 7a and 7b installed outside of the chamber 1, or an RF coil (not shown in the figure) used in placed of the electrrodes 7a and 7b, are energized by power source 8 supplying RF power at approximately 1.5 KW, and 13.56 MHZ, for example, to produce a plasma in the reaction chamber 1 fore 3 to 5 minutes. The $O_2$ plasma readily reacts with, i.e. decomposes, the affected surface of the photoresist on the semiconductor wafers, while the inner side of the photoresist remains hard enough to support the affected surface of the photoresist, as a result of being cooled by the coolant flowing through the cooling susceptors 4. Thus, very little residue of the affected photoresist remains on the surface of the wafer. As an alternative RF power source, 400 W at 400 KHZ may be employed for producing strong plasma sputtering under vacuum conditions at 1 Torr of oxygen gas. The below-described data obtained at such conditions according to the present invention illustrates the effect of the cooling of the wafer.

| Temperature of the coolant | Amount of residual particles per some specific area | |
|---|---|---|
| | Data 1 | Data 2 |
| 27.4° C. | 190 | 335 |
| −1.1° C. | 142 | 245 |
| −14.1° C. | 107 | 140 |

Figure 2:
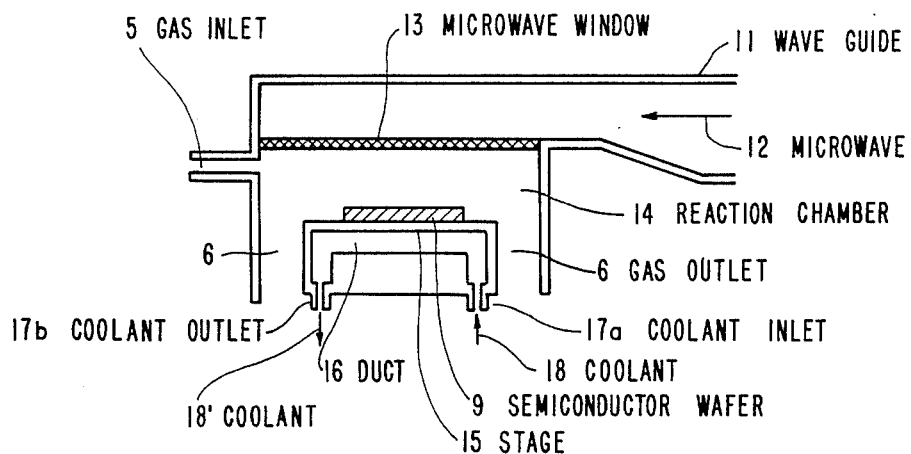
FIG. 2 is a schematic cross-sectional view illustrating a plasma processing apparatus for processing a single wafer system in accordance with a second embodiment of the present invention.

Another embodiment of the invention for removing the photoresist in a single wafer system is shown in FIG. 2, where microwave power is employed for producing a gas plasma. The microwave power of 2.45 GHZ is supplied from a microwave power source (not shown in the figure) in the direction of the arrow mark 12 through a wave guide 11, and is fed into the reaction chamber 14 made of a meal material through a microwave window 13 made of a dielectric material, e.g. quartz or ceramic. A semiconductor wafer 9 is described above having affected photoresist thereon to be removed as in FIG. 1, is loaded on a stage 15 with the affected photoresist-coated surface facing upwardly. The stage 15 is cooled by a coolant 18 flowing through a duct 16 installed in the stage 15, and introduced from a coolant inlet 17a and drained through a coolant outlet 17b. Other numerals designate the same or corresponding parts of FIG. 1. A reaction gas $O_2$ is fed from the gas inlet 5 into the interior of the reaction chamber 14 at a flow rate of approximately 200 cc/min. And at the same time, the chamber 14 is evacuated by a vacuum pump (not shown in the figure) through a gas outlet 6 to keep the inside of the chamber at a vacuum of approximately 3 Torr. The microwave power fed into the chamber 14 produces an oxygen plasma therein. Thus, the oxygen plasma removes the photoresist in the same way as described above in connection with the apparatus of FIG. 1. Good removal of the photoresist is confirmed after application of the microwave power for 3 to 5 minutes. A layer of grease for fixing the wafer onto the susceptor 4 or stage 15 is effective to reduce the time needed for perfect removal of the affected photoresist, because the grease results in improved heat conduction between the wafer 9 and the susceptor 4 or stage 15.

Good removal of the affected photoresist is also confirmed when argon gas (Ar) or nitrogen gas ($N_2$) is added to the oxygen gas for stabilizing the plasma production, and a fluoride gas, such as carbon tetrafluoride gas ($CF_4$) etc., may be added to the oxygen gas for promoting the reaction.

Additional processing by wet chemical washing or down stream ashing, though they are not necessary for most cases, may be employed after the ashing process if needed for assuring better removal of the photoresist.

The many features and advantages of the invention are apparent from the detailed specification and thus, it is intended by the following claims to cover such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of ashing a photoresist coated on a semiconductor wafer, comprising the steps of:
   patterning a photoresist on a semiconductor wafer;
   ion-implanting a dopant into the semiconductor wafer through openings of the resist, said ion-implanting step affecting a surface of the photoresist by forming carbonates thereon;
   cooling the semiconductor wafer after the ion-implanting step by making use of cooling means; and
   ashing the photoresist by making use of a plasma of a reaction gas during said cooling step.

2. A method of claim 1, wherein the reaction gas comprises oxygen gas.

3. A method of claim 2, wherein the reaction gas further comprises a gas selected from the group consisting of argon gas and nitrogen gas.

4. A method of claim 2, wherein the reaction gas further comprises a flouride gas.

5. A method of claim 1, wherein the plasma is produced by a radio frequency power excitation.

6. A method of claim 1, wherein said cooling means is a supporting member on which the semiconductor wafer is placed, said supporting member being provided with conduction means installed therein, a coolant being supplied to flow through said conduction means.

7. A method of ashing a photoresist disposed on a semiconductor wafer, comprising the steps of:
   patterning a photoresist on a semiconductor wafer;
   ion-implanting a dopant into the semiconductor wafer through openings of the resist, said ion-implanting affecting a surface of the photoresist by forming carbonates, fluorides, aluminum chloride, or polymers, said affected surface being more resistant to ashing than an unaffected surface of the photoresist;
   placing the semiconductor wafer in a combined cooling and ashing apparatus;
   cooling the semiconductor wafer in the combined cooling and ashing apparatus;
   ashing the photoresist with a plasma of a reaction gas in the combination cooling and ashing apparatus during said cooling step.

* * * * *